United States Patent
Franco et al.

(10) Patent No.: US 12,108,519 B2
(45) Date of Patent: Oct. 1, 2024

(54) ASSEMBLY OF AN ELECTRONIC BOARD AND A HEAT SINK, AND MOTOR-FAN UNIT COMPRISING SUCH AN ASSEMBLY

(71) Applicant: Valeo Systemes Thermiques, Le Mesnil Saint-Denis (FR)

(72) Inventors: Ismaël Franco, Le Mesnil Saint-Denis (FR); Biagio Provinzano, Le Mesnil Saint-Denis (FR); Onur Tas, Le Mesnil Saint-Denis (FR)

(73) Assignee: VALEO SYSTEMES THERMIQUES, Le Mesnil-Saint-Denis (FR)

( * ) Notice: Subject to any disclaimer, the term of this patent is extended or adjusted under 35 U.S.C. 154(b) by 186 days.

(21) Appl. No.: 17/783,871

(22) PCT Filed: Dec. 2, 2020

(86) PCT No.: PCT/FR2020/052245
§ 371 (c)(1),
(2) Date: Jun. 9, 2022

(87) PCT Pub. No.: WO2021/116561
PCT Pub. Date: Jun. 17, 2021

(65) Prior Publication Data
US 2023/0011304 A1    Jan. 12, 2023

(30) Foreign Application Priority Data

Dec. 12, 2019    (FR) ...................................... 1914322

(51) Int. Cl.
*H05K 1/00* (2006.01)
*H05K 1/02* (2006.01)
(Continued)

(52) U.S. Cl.
CPC ............. *H05K 1/0204* (2013.01); *H05K 3/30* (2013.01); *H05K 7/2039* (2013.01)

(58) Field of Classification Search
CPC ....... G06F 1/20; G06F 1/203; H01L 23/3672; H05K 2201/066; H05K 7/20154; H05K 1/0203; H05K 7/2039; H05K 7/20509
(Continued)

(56) References Cited

U.S. PATENT DOCUMENTS

| 5,285,350 A | 2/1994 | Villaume |
| 6,600,655 B1 | 7/2003 | Dailey et al. |

(Continued)

FOREIGN PATENT DOCUMENTS

| CN | 101815874 A | 8/2010 |
| CN | 109075650 A | 12/2018 |

(Continued)

OTHER PUBLICATIONS

International Search Report and Written Opinion in corresponding International Application No. PCT/FR2020/052245, mailed Mar. 16, 2021 (11 pages).

(Continued)

*Primary Examiner* — Mandeep S Buttar
(74) *Attorney, Agent, or Firm* — Osha Bergman Watanabe & Burton LLP

(57) ABSTRACT

Disclosed is an assembly (11) of an electronic board (22) and a heat sink (24), in particular for a motor-fan unit (10) of a motor vehicle, comprising an electronic board (22); a heat sink (24) comprising a plate (28) fastened to the electronic board (22), the surface of which has through-openings (30); and a thermal paste (26) arranged between the electronic board (22) and the plate (28).

10 Claims, 7 Drawing Sheets

(51) Int. Cl.
  *H05K 3/30* (2006.01)
  *H05K 7/20* (2006.01)
(58) Field of Classification Search
  USPC .......................................................... 361/710
  See application file for complete search history.

(56) References Cited

U.S. PATENT DOCUMENTS

| | | | | |
|---|---|---|---|---|
| 7,365,989 | B2* | 4/2008 | Peng | .................... H01L 23/427 |
| | | | | 361/720 |
| 7,443,680 | B1* | 10/2008 | Peng | .................... H01L 23/467 |
| | | | | 165/185 |
| 7,990,719 | B2* | 8/2011 | Chen | .................. H05K 7/20154 |
| | | | | 174/16.3 |
| 2002/0186542 | A1* | 12/2002 | Choi | .................. H01L 23/3677 |
| | | | | 257/E23.101 |
| 2004/0037040 | A1* | 2/2004 | Yu | .................... H05K 7/20509 |
| | | | | 165/80.3 |
| 2004/0212964 | A1* | 10/2004 | Belady | .................... H01L 23/36 |
| | | | | 257/E23.101 |
| 2008/0158820 | A1* | 7/2008 | Peng | .................... H01L 23/427 |
| | | | | 165/122 |
| 2011/0279969 | A1* | 11/2011 | Memon | ................. H01L 23/427 |
| | | | | 361/679.47 |

FOREIGN PATENT DOCUMENTS

| | | |
|---|---|---|
| FR | 2921446 A1 | 3/2009 |
| FR | 3092657 A1 | 8/2020 |
| GB | 2162694 A | 2/1986 |

OTHER PUBLICATIONS

Office Action issued in counterpart Chinese Patent Application No. CN 202080092861.0 mailed Mar. 8, 2024 (16 pages).

* cited by examiner

ASSEMBLY OF AN ELECTRONIC BOARD AND A HEAT SINK, AND MOTOR-FAN UNIT COMPRISING SUCH AN ASSEMBLY

TECHNICAL FIELD

The invention relates to an assembly of a circuit board and a heat sink for a motor vehicle motor-fan unit. The invention also relates to such a motor-fan unit and to a ventilation device for a motor vehicle, comprising such a motor-fan unit.

PRIOR ART

A motor-fan unit equips a motor vehicle heating, ventilation and/or air-conditioning device which regulates the temperature of an air flow intended to be fed into the interior of the vehicle.

The motor-fan unit serves to make the air flow enter and circulate in the heating, ventilation and/or air conditioning device as far as outlet openings, where the air enters the vehicle interior.

The motor-fan unit has, in a known manner, an electric motor, for example with brushes, on which an impeller for setting the air in motion is mounted, a device for controlling the electric motor, the electric motor control device comprising a circuit board and electronic components, and a heat sink.

Within the motor-fan unit, the heat sink has the purpose of cool the circuit board and the motor control electronic components, in particular high-power components. Conventionally, the heat sink is in the form of a plate equipped with studs protruding from the plate, the plate and the studs being made from a thermally conductive material.

This solution has the drawback of being bulky, on account of the presence of the studs. In addition, the effectiveness of the cooling is not always satisfactory.

The weight of this type of heat sink is also relatively high.

In addition, a heat sink comprising studs is conventionally produced by molding. This manufacturing method is particularly expensive, thereby increasing the total cost of the heat sink.

An aim of the invention is to provide an assembly of a circuit board and a heat sink that does not exhibit at least some of the drawbacks of the prior art.

Furthermore, the unpublished application FR1901364 discloses a heat sink for a circuit board of a motor vehicle motor-fan unit, comprising a surface intended to exchange heat with an air flow set in motion by the motor-fan unit, referred to as exchange surface, said exchange surface comprising a planar portion configured such that, in a position installed in the motor-fan unit, the air flow set in motion by the motor-fan unit flows substantially parallel to said planar portion, the exchange surface also comprising a set of blind cavities flush with said planar portion.

SUMMARY

The present description proposes an assembly of a circuit board and a heat sink, in particular for a motor vehicle motor-fan unit, comprising:
- a circuit board;
- a heat sink comprising a plate which is fixed to the circuit board and the surface of which has through-openings and a thermal paste disposed between the circuit board and the plate.

It is thus possible to manufacture the heat sink by extrusion and cutting. Alternatively, the heat sink may be manufactured by punching a metal plate. Each of these manufacturing methods is more economical than a molding method, thereby making it possible to reduce the cost of the heat sink.

In addition, this configuration unexpectedly improves the convection of the air against the surface of the plate of the heat sink, allowing the cooling by the heat sink to be rendered more effective. This configuration allows the bulkiness of the heat sink to be reduced, this also allowing the aeraulic and acoustic performance to be improved by reducing pressure drops. This is because the heat sink offers less resistance in the air flow.

Moreover, the heat sink thus produced is lighter than those known from the prior art.

The assembly of the circuit board and the heat sink may have one or more of the following features:
- the thermal paste, disposed between the circuit board and the plate, is impermeable and/or adhesive;
- the thermal paste, disposed between the circuit board and the plate, has a thermal conductivity of between 1 W/mK and 50 W/mK;
- the thermal paste is an epoxy resin or made of silicone;
- the thermal paste forms a layer, with a thickness of between 25 μm and 450 μm, between the circuit board and the plate;
- the layer of thermal paste has at least one raised element extending into a through-opening in the plate;
- each through-opening in the plate has a polygonal, in particular hexagonal or rectangular, or circular section;
- the through-openings in the plate have a polygonal section, a ratio between the thickness of the plate and the length of a side of the polygonal section being between 0.005 and 0.5;
- each through-opening has a cross-sectional area of between 10 mm$^2$ and 500 mm$^2$;
- the through-openings are disposed in a grid of quadrilaterals, for rectangular and/or staggered quadrilaterals, or in a honeycomb grid;
- the assembly comprises at least one electronic component with an electronic component body and at least one fastening tab passing through the circuit board from the electronic component body to the plate, the fastening tab extending at least as far as a through-opening in the plate;
- a portion of the fastening tab between the circuit board and the free end is covered with the thermal paste, the electronic component preferably having at least two fastening tabs, each fastening tab being received in a through-opening;
- an electronic component has at least two fastening tabs, each fastening tab being received in a through-opening;
- an electronic component has at least two fastening tabs, each fastening tab being received in a respective through-opening, the respective through-openings preferably being adjacent to one another;
- the plate and/or the circuit board do/does not have holes for fastening by way of a screw or snap;
- the plate comprises at least one hole for fastening by way of a screw or snap, the plate preferably not having a through-opening in the vicinity of the fastening hole; and
- the plate is made of an aluminum alloy, for example AlSi12, Al9Cu or AlSi10.

According to another aspect, there is also described a motor-fan unit for a motor vehicle, comprising a motor, an impeller for setting an air flow in motion and configured to be driven by the motor, and a device for controlling the motor, the control device having an assembly of a circuit board and a heat sink as described above in all its combinations.

According to another aspect, there is also described a ventilation device for a motor vehicle, comprising:
a motor-fan unit as described above in all its combinations,
a duct, the impeller of the motor-fan unit being received in the duct, the plate being received in the duct, the plate forming in particular at least a portion of a wall of the duct.

According to yet another aspect, there is also described a method for manufacturing an assembly of a circuit board and a heat sink as described above in all its combinations, comprising the steps of:
providing the plate, wherein the step of providing the plate preferably involves a substep of extruding a profiled element, the section of which corresponds to the section of the plate, followed by a substep of cutting a plate out of the profiled element;
applying the thermal paste to the circuit board and/or to the plate; and
fastening the plate to the circuit board.

The step of providing the plate may also involve a substep of providing a solid plate, followed by a substep of punching the solid plate.

The step of fastening the plate to the circuit board may also comprise a substep of polymerizing the thermal paste in the air.

The step of fastening the plate to the circuit board may also comprise a substep of polymerizing the thermal paste by heating it.

BRIEF DESCRIPTION OF THE DRAWINGS

Further features, details and advantages will become apparent on reading the following detailed description, and on studying the appended drawings, in which.

DESCRIPTION OF THE EMBODIMENTS

Figure 1:
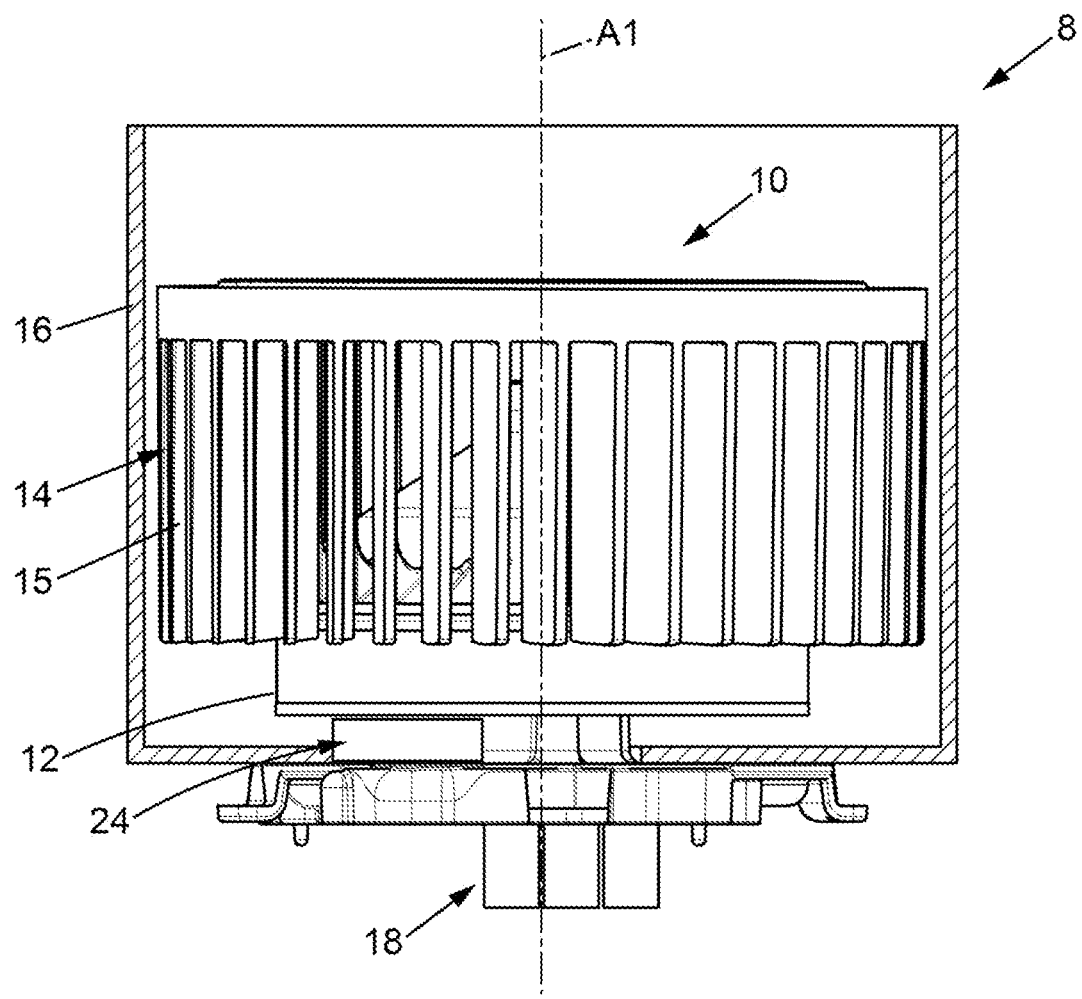
FIG. 1 illustrates a view in partial section of a detail of a vehicle ventilation device comprising a motor-fan unit.

A ventilation device for a motor vehicle, a detail of which is illustrated in FIG. 1, is described below with reference to the drawings.

The ventilation device 8 incorporates a motor-fan unit 10. The motor-fan unit 10 has a fan 14. The fan 14 in this case comprises an electric motor 12 and an impeller 15 configured to be driven in rotation by the motor 12 about an axis of rotation A1 common to the motor 14 and to the impeller 15. The impeller 15 is in this case received in a duct 16 of the ventilation device 8. Thus, the fan 14 generates an air flow in the duct 16.

The motor-fan unit 10 also comprises a device 18 for controlling the electric motor 12. The control device 18 includes a circuit board 22 and electronic components 20 (not visible in FIG. 1) fastened to the circuit board 22. The control device 18 makes it possible to control the electric motor 12 of the fan 14.

The motor-fan unit 10 also comprises a heat sink 24 that is able to cool the control device 18. As illustrated in FIG. 1, the heat sink 24 is received in the duct 16 in which the impeller 15 of the fan 14 is received. Alternatively, the heat sink 24 can be arranged so as to form a portion of a wall of the duct 16. These configurations allow the heat sink 24 to exchange heat with the air flow generated by the fan 14, in particular by convection.

Figure 2:
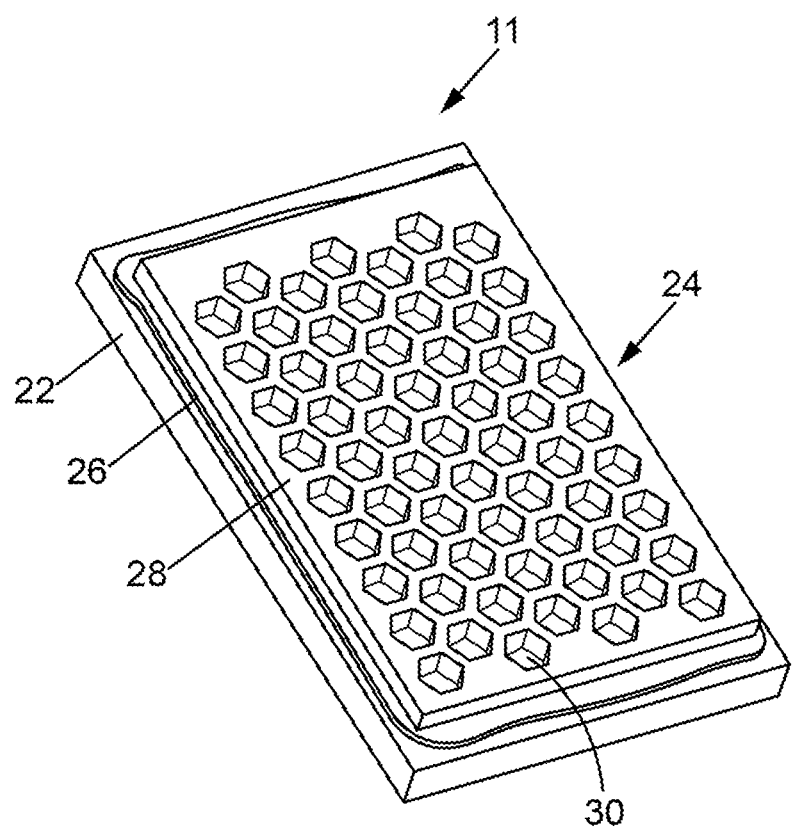
FIG. 2 illustrates a perspective view of a first example of the assembly of a circuit board and a heat sink that can be employed in the motor-fan unit in FIG. 1.

As illustrated in FIG. 2, the heat sink 24 comprises a plate 28 and a thermal paste 26. The heat sink 24 is fastened to the circuit board 22. The thermal paste 26 is disposed between the plate 28 and the circuit board 22. Thus, the motor-fan unit 10 comprises an assembly 11 made up of the circuit board 22 and the heat sink 24.

The plate 28 of the heat sink 24 has a surface, in a plane parallel to the plane of extension of the circuit board 22, having through-openings 30. The through-openings 30 allow the air flow generated by the fan 14 to pass into these through-openings 30 while creating turbulence in the air flow in the vicinity of the plate 28. In addition, the through-openings 30 make it possible to limit the weight of the plate 28 and, in the process, the weight of the heat sink 24.

The plate 28 is preferably made of a material exhibiting good thermal conductivity. For example, the plate 28 may be an aluminum alloy, in particular $AlSi_{12}$, $Al_9Cu$ or $AlSi_{10}$. These alloys have the advantage of exhibiting good thermal conductivity while being relatively lightweight.

Figure 3:
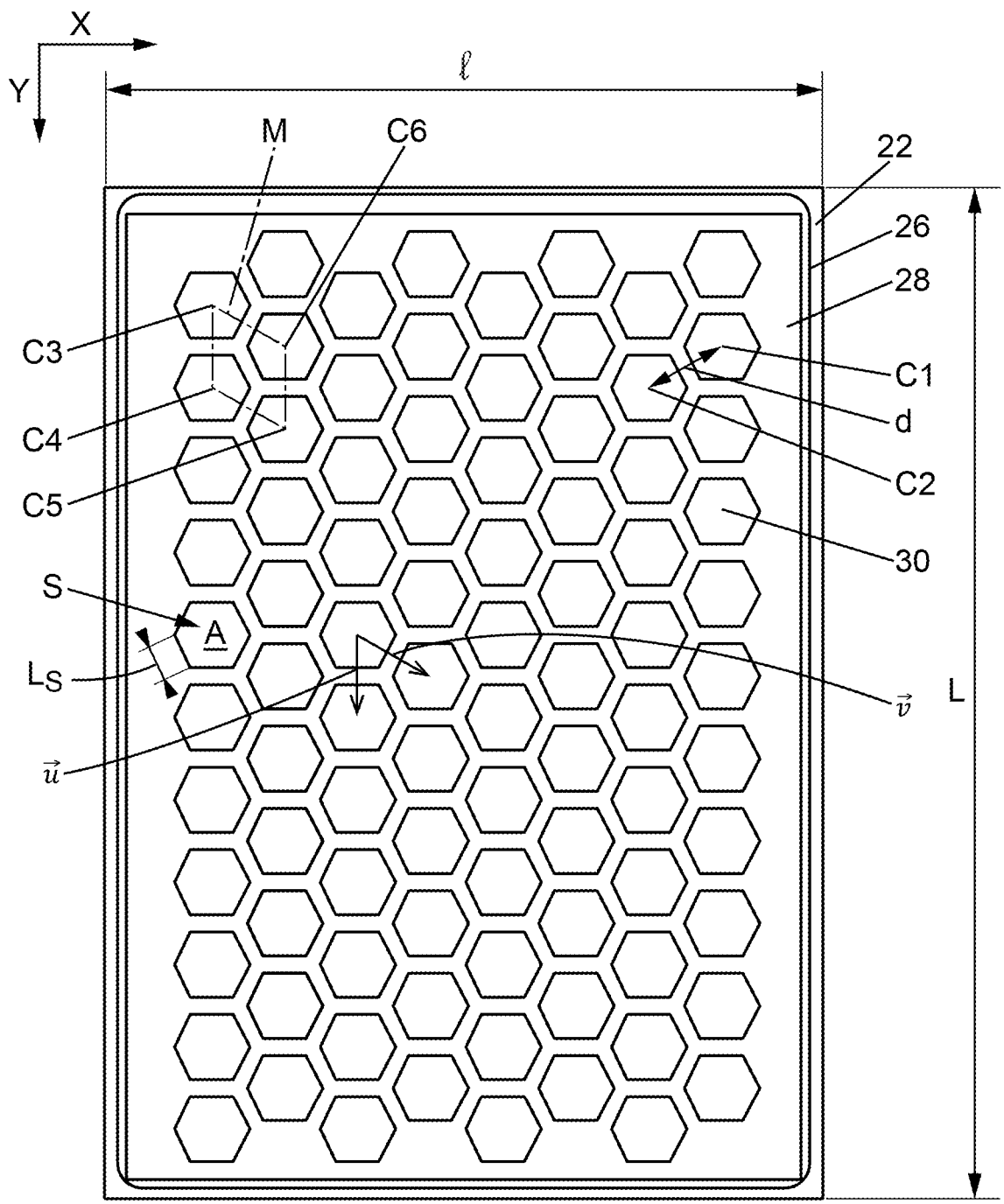
FIG. 3 illustrates a top view of the first example of the assembly of a circuit board and a heat sink in FIG. 2.

As illustrated in FIGS. 2 and 3, the through-openings 30 in the plate 28 may have a polygonal section S. Such a polygonal section S is relatively easy to produce. In the example illustrated, the section S is hexagonal. Preferably, the section S is in the form of a regular polygon, in particular of a regular hexagon.

The through-openings 30 have a substantially constant section through the plate 28. In other words, the through-openings 30 are substantially cylindrical, in this case with a polygonal section. Alternatively, however, the through-openings 30 may be frustoconical. In other words, the cross section of the through-openings 30 may be smaller on one face of the plate 28 compared with the other face of the plate 28. This may be the case in particular when the through-openings 30 are produced by punching.

The area A of the section S of the through-openings 30 is for example between 10 mm$^2$ and 500 mm$^2$. The area A is understood to be the maximum area of the section S, where appropriate.

The plate 28 has a length L, a width I and a thickness e. The length L of the plate 28 corresponds to its greatest dimension. For example, the length of the plate 28 is between 50 mm and 200 mm. The width I corresponds to the second greatest dimension of the plate 28, which may optionally be equal to the greatest dimension of the plate 28. The width I of the plate 28 is for example between 25 mm and 180 mm. In this case, the length L and the width I of the plate 28 are measured in a plane parallel to the plane of extension of the circuit board 22. Lastly, the thickness e1 of the plate 28 is the smallest dimension of the plate 28. In this case, the thickness e1 is measured in a direction normal to the plane of extension of the circuit board 22. The thickness e1 of the plate 28 is for example between 0.5 mm and 5 mm. The thickness e1 of the plate 28 advantageously has a small size compared with the length L and the width I of the plate 28. For example, the thickness e1 of the plate 28 is at least ten times smaller than the length L and the width I of the plate 28, preferably at least fifty times smaller than the length L and the width I of the plate 28. The through-openings 30 are oriented along the direction of the thickness of the plate 28.

A ratio e1/L between the thickness e1 of the plate 28 and the length L of one side of the polygonal section S is for example between 0.005 and 0.5. Such a ratio ensures good circulation of the air flow generated by the fan 14 in the through-openings 30.

A ratio between a length $L_s$ of one side of the polygonal section S and a distance d between two centers C1, C2 of two adjacent openings 30, which is illustrated in FIG. 3, is for example between 0.1 and 0.5. Such values of the ratio $L_s/d$ ensure a satisfactory level of occupation of the through-openings 30 in the surface of the plate 28.

As illustrated in FIG. 3, the distance d between the centers C1, C2 of two adjacent openings 30 is the same over the entire plate 28. The distribution of the through-openings 30 over the plate 28 is thus regular, making it possible to achieve regular cooling by virtue of the plate 28. The stiffness of the plate 28 may thus also be the same over the region of the plate 28 in which the through-openings 30 are made. Moreover, this may make it easier to manufacture the plate 28, in particular by punching.

Alternatively, the plate 28 may comprise regions without through-openings 30. Thus, these regions exhibit greater stiffness than the rest of the plate 28. Advantageously, manufacturing by punching makes it possible to avoid the regions that require greater stiffness.

As illustrated in FIG. 3, the through-openings 30 are disposed in a grid. A grid is understood in this case to be a regular or irregular division of the plane of the plate 28 by one or more patterns which is/are repeated. In this instance, the grid is regular and made up of a pattern M that repeats in two linearly independent directions $\vec{u}, \vec{v}$. A distribution of the through-openings 30 in such a grid makes it possible to achieve regular cooling over the entire surface of the plate 28. Moreover, a satisfactory compromise between the stiffness and the weight of the plate 28 is thus achieved.

For example, in FIG. 3, a pattern M is a parallelogram formed by the centers C3, C4, C5, C6 of four adjacent through-openings 30. Such a pattern M makes it possible to optimize the level of occupation of the through-openings 30 over the plate 28, while preserving satisfactory stiffness of the plate 28.

The grid M illustrated in FIG. 3 may, however, be described as a honeycomb grid in that the through-openings 30, which are hexagonal, in this case form a honeycomb pattern. Thus, in this grid, each side of a through-opening 30 extends parallel and next to a side of an adjacent through-opening 30. This type of grid advantageously makes it possible to maximize the number of through-openings 30 in the plate 28, while preserving the stiffness of the plate 28.

The pattern M is distributed over substantially the entire main surface of the plate 28. Specifically, the edge of the plate 28 in this case does not have through-openings 30.

Figure 4:
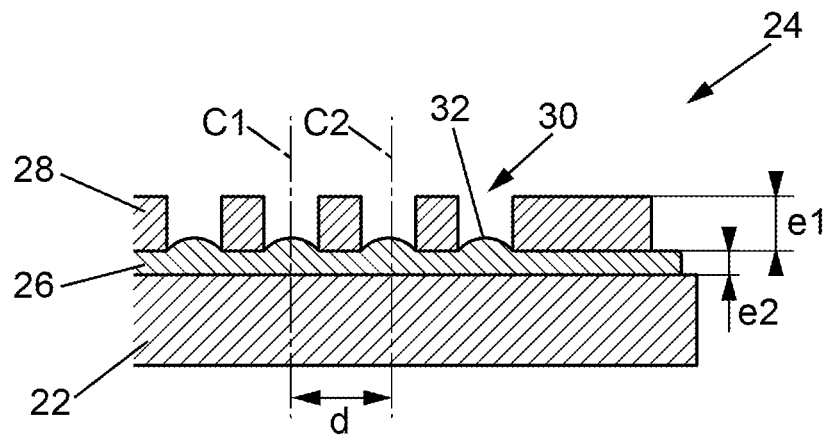
FIG. 4 illustrates a detail of a longitudinal section through the first example of the assembly of a circuit board and a heat sink in FIG. 2.

As can be seen in FIG. 4, the heat sink 24 comprises a thermal paste 26 disposed between the circuit board 22 and the plate 28. The thermal plate 26 thus fills microcavities present between the plate 28 and the circuit board 22. The microcavities present between the plate 28 and the circuit board 22 would be likely to trap air, which exhibits significant thermal resistance. Thus, it is preferable to fill the microcavities by means of the thermal paste 26 in order to improve heat transfers between the circuit board 22 and the plate 28.

For example, the thermal plate 26 has a thermal conductivity of between 1 W/mK and 50 W/mK. The thermal conductivity of the thermal paste 26 is preferably greater than that of air.

The thermal paste 26 forms for example a layer between the circuit board 22 and the plate 28. The thickness e2 of the layer, measured between the plate 28 and the circuit board 22, is for example between 25 µm and 450 µm. The thickness e2 is thus sufficient to fill the microcavities between the circuit board 22 and the plate 28. Nevertheless, the thermal paste may have a thermal conductivity lower than that of the plate 28. Thus, it is preferable to limit the thickness e2 of the thermal plate 26 for better transfer of heat from the circuit board 22 to the air flow of the fan 24.

The thermal paste 26 may be adhesive. In this case, the thermal paste 26 may make it possible to fasten the plate 28 to the circuit board 22. Such an adhesive thermal paste 26 is for example Semicosil® 9712 silicone.

When the thermal paste 26 is adhesive, it is possible for the plate 28 and/or the circuit board 22 not to have holes for fastening screws or snaps. Specifically, in this case, the plate 28 can be fastened to the circuit board 22 only by means of the thermal paste 26, preferably without employing any fastening screw. A hole for fastening by way of a screw or snap differs from a through-hole 30 notably by its circular, optionally threaded, shape, and/or by the area of its section, which is smaller than the area A of the section S of a through-hole 30.

The thermal paste 26 may furthermore be impermeable. Impermeable in this case means watertight. In this case, the thermal paste 26 makes it possible to protect the circuit board 22 and the electronic components 20 from the moisture present in the air flow generated by the fan 14. Such an impermeable thermal paste 26 is for example Semicosil® 9712 silicone.

The thermal paste 26 may also be both adhesive and impermeable. Such a thermal paste 26 that is both adhesive and impermeable is for example Semicosil® 9712 silicone.

If the thermal paste 26 does not provide sealing at the periphery of the plate 28, a seal can be disposed at the periphery of the plate 28 in order to provide this sealing. The seal prevents the air flowing along the plate 28 from coming into contact with the electronic components 20 situated on the opposite face of the circuit board 22 from the face fastened to the plate 28. The presence of the seal makes it possible for example to use a non-impermeable thermal paste 26.

The layer of thermal paste 26 may form a relief 32 protruding into the through-openings 30, as illustrated in FIG. 4. The relief 32 may be formed under the effect of the weight of the plate 28 on the thermal paste 26.

Figure 5:
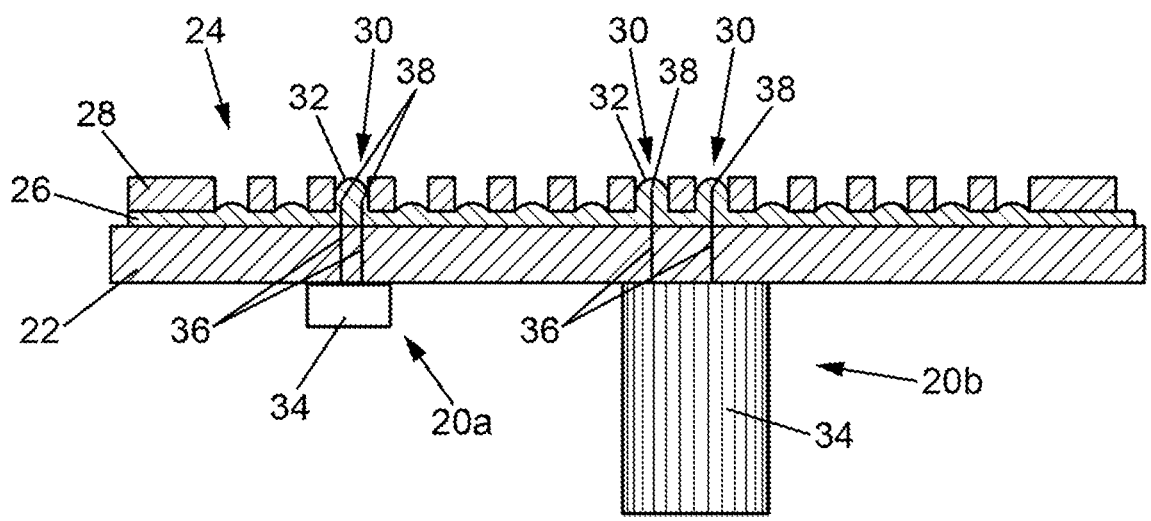
FIG. 5 illustrates another detail of a longitudinal section through the assembly of the circuit board and the heat sink in FIG. 2.

In FIG. 5, two electronic components 20a, 20b fastened to the circuit board 22 are illustrated. Each electronic component 20a, 20b comprises, as illustrated, a body 34 and, in this case, two fastening tabs 36. Each fastening tab 36 extends in this case from the body 34 of the associated electronic component 20a, 20b to the plate 28, passing through the circuit board 22. In this case, each fastening tab 36 extends from the body 34 of the associated electronic component 20a, 20b as far as a free end 38 of the fastening tab 36 in question. Each free end 38 is in this case received in a through-opening 30. This makes it possible to avoid contact between the plate 28 and an electronic component 20a, 20b. Moreover, the free ends 36 of the different fastening tabs 36 do not protrude from the plate 28.

In the example in FIG. 5, the portion of the fastening tabs 36 between the circuit board 28 and the free end 38 of the fastening tabs 36 does not protrude from the layer of thermal paste 26. Thus, the free end 38 of the fastening tabs 36, in particular, is covered with thermal paste 26. Thus, the free end 38 of the fastening tabs 36 is not in direct contact with the surrounding environment. This makes it possible for example to protect the electronic components 20a, 20b from the moisture in the air flow generated by the fan 14, in particular when the thermal paste 26 is impermeable.

As illustrated in FIG. 5, the first electronic component 20a has two fastening tabs 36 such that the distance between the two fastening tabs 36 is less than the diameter of a through-hole. The term "diameter" is understood here, in the broad sense, as meaning the greatest distance measured between two points of the section S of the through-hole 30. In this case, advantageously, the two fastening tabs 36 of the electronic component 20a can be received in one and the same through-hole 30.

Alternatively, the distance between the fastening tabs 36 of an electronic component 20b is preferably chosen such that the fastening tabs 36 are received in separate through-openings 30. This limits the risks of contact between the fastening tabs 36. In particular, as illustrated in FIG. 5, the distance between the fastening tabs 36 of an electronic component 20b is chosen such that the fastening tabs 36 are received in adjacent through-openings 30. To this end, electronic components 20 are chosen in which the distance between the fastening tabs 36 is substantially equal to the distance d between the center C1, C2 of two adjacent through-openings 30.

Figure 6:
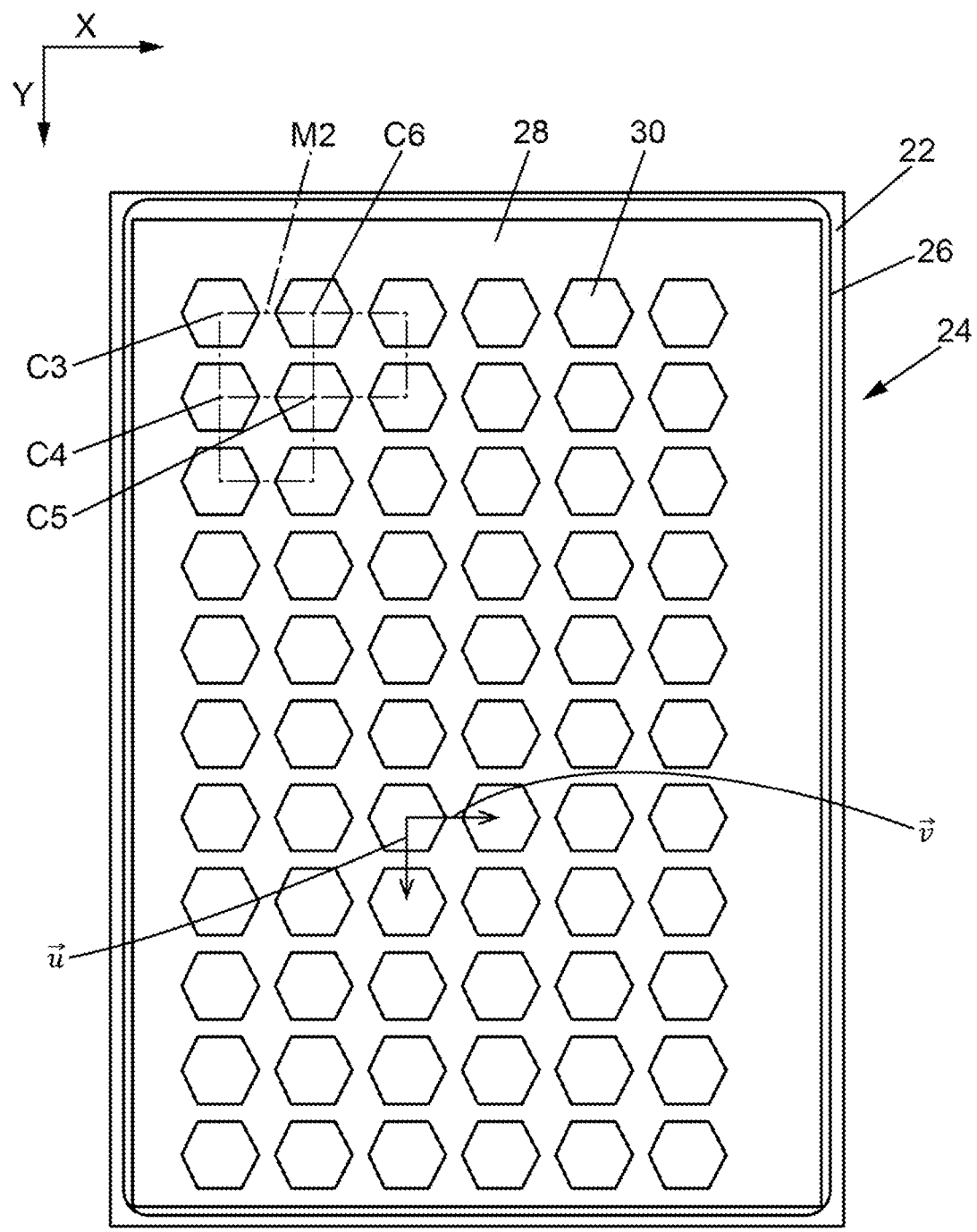
FIG. 6 illustrates a frontal view of a second example of the assembly of a circuit board and a heat sink that can be employed in the motor-fan unit in FIG. 1.

FIG. 6 illustrates a second example of a plate 28, in which the through-openings 30 define a second example of a grid. The distributed pattern M2 is formed by the centers C3, C4, C5, C6 of four adjacent through-openings 30. The pattern M2 thus defined is a rectangle, which repeats over substantially the entire surface of the plate 28, on moving in translation in two perpendicular directions $\vec{u}$, $\vec{v}$. A grid of quadrilaterals is thus defined, by repetition of a quadrilateral pattern.

Figure 7:
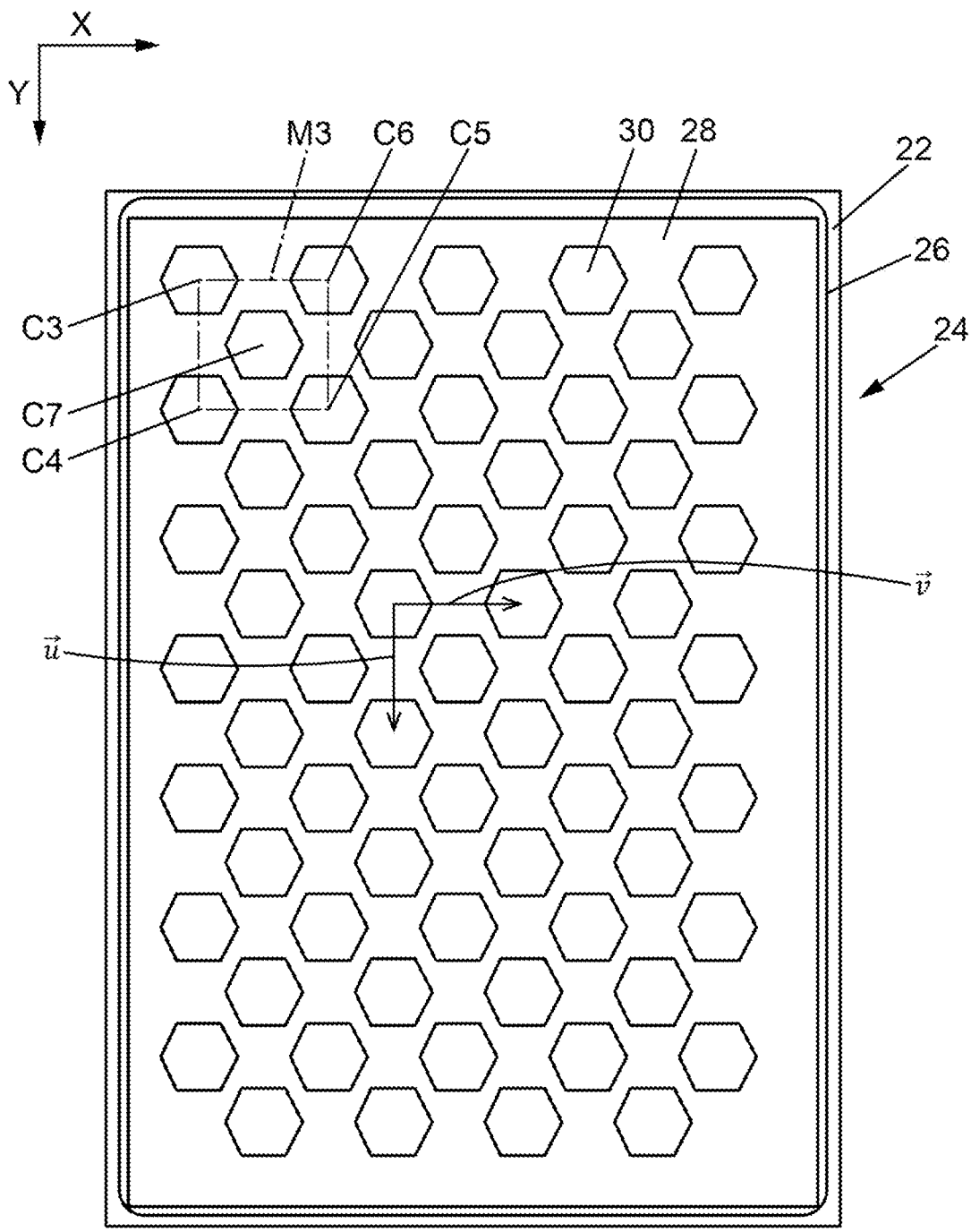
FIG. 7 illustrates a frontal view of a third example of the assembly of a circuit board and a heat sink that can be employed in the motor-fan unit in FIG. 1.

FIG. 7 illustrates a third example of a plate 28, in which the through-openings 30 define a third example of a grid. In this case, the through-openings 30 define a pattern M3 of staggered centers of through-openings 30. The term staggered is understood in this case as meaning that the pattern M3 is defined by a group of five adjacent through-openings 30, such that the centers C3, C4, C5, C6 of four of them define a rectangle, in particular a square, and the center C7 of the fifth through-opening 30 is located substantially at the center of the rectangle C3C4C5C6. The pattern M3 thus defined is rectangular, which repeats over substantially the entire surface of the plate 28, on moving in translation in two perpendicular directions $\vec{u}$, $\vec{v}$. The grid thus produced may be described as a grid of staggered quadrilaterals. This type of grid allows a compromise between the level of occupation of through-openings 30 in the plate 28, and the stiffness of the plate 28.

Figure 8:
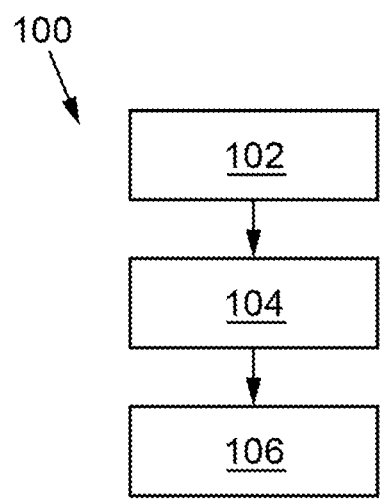
FIG. 8 illustrates a bar chart of a manufacturing method for obtaining an assembly of a circuit board and a heat sink according to one of FIGS. 2, 6 and 7.

An example of a method 100 for manufacturing an assembly 11 of a circuit board 22 and of a heat sink 24 as described above will now be described with reference to FIG. 8.

As illustrated, the manufacturing method 100 comprises a first step 102 of providing the plate 28.

The step 102 of providing the plate may comprise a first substep of extruding a profiled element. The profiled element may then have as many longitudinal ducts as the plate 28 has through-openings 30. The profiled element may in particular have a cross section substantially identical to the section of the plate 28. The step 102 of providing the plate 28 may then have a second substep of cutting the profiled element obtained in the first substep in order to obtain a plate 28 with the desired thickness e1. Advantageously, the step 102 of providing the plate 28 then has no other subsequent substep.

Alternatively, the step 102 of providing the plate 28 may comprise a first substep of providing a plate with a solid section, following by a second substep of creating through-openings 30. In this case, the through-openings 30 may in particular be produced by punching.

The manufacturing method 100 then comprises a second step 104 of applying thermal paste 26 to the circuit board 22 and/or to the plate 28.

The manufacturing method 100 continues with a third step 106 of fastening the plate 28 to the circuit board 22. The fastening step 106 may have a substep of polymerizing the thermal paste 26 in the air. Alternatively, the fastening step 106 may have a substep of polymerizing the thermal paste 26 by heating it.

Advantageously, the fastening step 106 does not comprise a substep of fastening the plate 28 to the circuit board 22 by screwing or of fastening the plate 28 to the circuit board 22 by staking.

The invention is not limited only to the examples described above but is the subject of numerous variants that are accessible to those skilled in the art.

In the examples described, the through-openings 30 have a polygonal section S. However, the through-openings 30 may have a circular section. Openings with circular sections may in fact be easier to produce, in particular by drilling or punching.

The through-openings 30 may not all have the same section S over the entire plate 28. For example, through-openings 30 may have a first polygonal section, and other through-openings 30 may have a second polygonal section or a circular section.

The through-openings 30 may be distributed in other types of grid than those described above.

In particular, a grid is possible which is made up of a pattern that is reproduced irregularly over the plate 28 or substantially the entire plate 28 ("irregular grid"). Alternatively, a pattern is possible which consists of the regular or irregular reproduction of two or more patterns.

Through-openings 30 may not be present over the entire surface of the plate 28, in particular in order to locally stiffen the plate. In particular, when the plate has a hole for fastening by a screw of snap, it may be preferred for the plate 28 not to have through-openings 30 in the vicinity of this hole for fastening by a screw or snap.

The invention claimed is:
1. An assembly for a motor vehicle motor-fan unit, comprising: a circuit board; a heat sink comprising a plate which is fixed to the circuit board, the plate having a surface of that has through-openings, and a thermal paste disposed between the circuit board and the plate; and at least one electronic component with an electronic component body and at least one fastening tab passing through the circuit board from the electronic component body to the plate, the fastening tab extending at least as far as a through-opening in the plate; and wherein a portion of the fastening tab between the circuit board and a free end is covered with the thermal paste, the electronic component having at least two fastening tabs, each fastening tab being received in a through-opening.

2. The assembly as claimed in claim 1, wherein the thermal paste is impermeable and/or adhesive.

3. The assembly as claimed in claim 1, wherein each through-opening in the plate has a hexagonal, rectangular, or circular section.

4. The assembly as claimed in claim 1, wherein the through-openings in the plate have a polygonal section, a ratio between the thickness of the plate and the length of a side of the polygonal section being between 0.005 and 0.5.

5. The assembly as claimed in claim 1, wherein the through-openings are disposed in a grid of quadrilaterals, for rectangular and/or staggered quadrilaterals, or in a honeycomb grid.

6. The assembly as claimed in claim 1, wherein the plate and/or the circuit board do/does not have screw-fastening holes.

7. The assembly as claimed in claim 1, wherein the plate comprises at least one hole for fastening by way of a screw or snap, the plate not having a through-opening in the vicinity of the at least one fastening hole.

8. A motor-fan unit for a motor vehicle, comprising:
a motor;
an impeller for setting an air flow in motion and configured to be driven by the motor; and
a control device for controlling the motor, the control device having an assembly of a circuit board and a heat sink as claimed in claim 1.

9. A method for manufacturing an assembly of a circuit board and a heat sink as claimed in claim 1, the method comprising:
providing the plate by extruding a profiled element, a section of which corresponds to a section of the plate, followed by cutting a plate out of the profiled element;
applying the thermal paste to the circuit board and/or to the plate; and
fastening the plate to the circuit board.

10. The assembly as claimed in claim 1, wherein a portion of the fastening tab between the circuit board and a free end is covered with the thermal paste.

* * * * *